United States Patent
Golcuk et al.

(10) Patent No.: US 9,806,394 B2
(45) Date of Patent: Oct. 31, 2017

(54) 0/90 DEGREE COUPLER WITH COMPLEX TERMINATION

(71) Applicant: MEDIATEK INC., Hsin-Chu (TW)

(72) Inventors: Fatih Golcuk, San Jose, CA (US);
Yuen Hui Chee, San Jose, CA (US);
Osama K. A. Shana'a, Los Altos, CA (US)

(73) Assignee: MEDIATEK INC., Hsinchu (TW)

( * ) Notice: Subject to any disclaimer, the term of this patent is extended or adjusted under 35 U.S.C. 154(b) by 44 days.

(21) Appl. No.: 14/862,489

(22) Filed: Sep. 23, 2015

(65) Prior Publication Data

US 2016/0344086 A1    Nov. 24, 2016

Related U.S. Application Data (60) Provisional application No. 62/164,122, filed on May 20, 2015.

(51) Int. Cl.
*H01P 5/12* (2006.01)
*H03H 7/38* (2006.01)
(Continued)

(52) U.S. Cl.
CPC ............... *H01P 5/18* (2013.01); *H01P 5/185* (2013.01); *H03F 3/19* (2013.01); *H03F 3/211* (2013.01);
(Continued)

(58) Field of Classification Search
CPC .............. H01P 5/18; H01P 5/184; H03H 7/38
(Continued)

(56) References Cited

U.S. PATENT DOCUMENTS

| 3,419,824 | A | | 12/1968 | Seidel | 327/257 |
| 4,460,875 | A | * | 7/1984 | Harman | H03F 1/345 330/286 |

(Continued)

FOREIGN PATENT DOCUMENTS

| JP | H0756929 B2 | 6/1990 |
| JP | H0457405 A | 10/2016 |

OTHER PUBLICATIONS

EPO, Search Report for the EP patent application 16151473.2 dated Oct. 6, 2016 (17 pages).

(Continued)

*Primary Examiner* — Dean Takaoka
(74) *Attorney, Agent, or Firm* — Imperium Patent Works; Lester Wallace; Zheng Jin (57) ABSTRACT

The isolated port of a 0/90 degree coupler is terminated by a novel complex termination impedance circuit having a reactance. The absolute value of the reactance is at least two ohms. The coupler receives a signal on its input port, and outputs a first signal on its first output port and a second signal on its second output port. A first load is coupled to the first output port without an intervening matching network. A substantial impedance mismatch exists between the first output port and the first load. A second load is coupled to the second output port without an intervening matching network. A substantial impedance mismatch exists between the second output port and the second load. Despite the substantial impedance mismatches, the first and second signals have a phase difference in a range of from 88 degrees to 92 degrees while exhibiting an amplitude imbalance less than 2 dB.

21 Claims, 8 Drawing Sheets

AMPLIFIER CIRCUIT FOR SINGLE-ENDED RF SIGNAL (51) Int. Cl.
*H01P 5/18* (2006.01)
*H03F 3/60* (2006.01)
*H03H 7/21* (2006.01)
*H03H 7/48* (2006.01)
*H03F 3/19* (2006.01)
*H03F 3/21* (2006.01)
*H03F 3/45* (2006.01)

(52) U.S. Cl.
CPC ..... *H03F 3/45188* (2013.01); *H03F 3/45475* (2013.01); *H03F 3/60* (2013.01); *H03F 3/602* (2013.01); *H03H 7/21* (2013.01); *H03H 7/38* (2013.01); *H03H 7/48* (2013.01); *H03F 2200/198* (2013.01); *H03F 2200/451* (2013.01); *H03F 2203/45481* (2013.01)

(58) Field of Classification Search
USPC .................................. 333/109–112, 116, 117
See application file for complete search history.

(56) References Cited

U.S. PATENT DOCUMENTS

| | | | | |
|---|---|---|---|---|
| 7,907,032 B2* | 3/2011 | Yamamoto | ................ | H01P 5/18 333/116 |
| 8,289,102 B2* | 10/2012 | Yamamoto | ................ | H01P 5/18 333/116 |
| 8,315,576 B2* | 11/2012 | Jones | ..................... | H01P 5/184 333/109 |
| 8,410,864 B2* | 4/2013 | Charley | ................... | H01P 5/18 333/109 |
| 2002/0063596 A1 | 5/2002 | Brandt | ............................ | 330/53 |
| 2014/0155003 A1 | 6/2014 | Nakatani | ...................... | 455/90.2 |
| 2015/0214909 A1 | 7/2015 | Kobayashi | .................... | 330/295 |

OTHER PUBLICATIONS

Erik Öjefors et al., Subharmonic 220- and 320-GHz SiGe HBT Receiver Front-Ends, IEEE Transactions on Microwave Theory and Techniques, vol. 60. No. 5, May 2012 (8 pages).

Robert C. Frye et al., A 2GHz Quadrature Hybrid Implemented in CMOS Technology, IEEE 2002 Custom Integrated Circuits Conference (4 pages).

R. C. Frye, S. Kapur, and R. C. Melville, "A 2 GHz quadrature hybrid implemented in CMOS technology", *IEEE JSSC*, vol. 38, pp. 550-555, Mar. 2003.

J. Park, S. Kousai, and H. Wang, "A fully differential ultra-compact broadband transformer based quadrature generation scheme", *IEEE CICC*, Sep. 2013.

J.-S. Syu, C. Meng and Y.-C. Yen "5.7 GHz Gilbert I/Q downconverter integratedwith a passive LO quadrature generator and an RF marchand balun", *IEEE Microw. Wireless Compon. Lett.*, vol. 18, No. 2, pp. 127-129 2008.

* cited by examiner

AMPLIFIER FOR SINGLE-ENDED RF SIGNAL
(PRIOR ART)

FIG. 1

COUPLER
(PRIOR ART)

FIG. 2

MATCHING NETWORK
(PRIOR ART)

FIG. 3

AMPLIFIER FOR DIFFERENTIAL RF SIGNAL
(PRIOR ART)

FIG. 4

MATCHING NETWORK
(PRIOR ART)

FIG. 5

AMPLIFIER CIRCUIT FOR SINGLE-ENDED RF SIGNAL

FIG. 6

ONE EXAMPLE OF THE COMPLEX
TERMINATION IMPEDANCE CIRCUIT

FIG. 7

SIGNAL COMBINER NETWORK

FIG. 8

FIG. 9
LAYOUT OF THE COUPLER, ITS CONNECTION TO THE AMPLIFIERS, AND THE COMPLEX TERMINATION IMPEDANCE CIRCUIT

FIG. 10

ONE EXAMPLE OF THE COMPLEX
TERMINATION IMPEDANCE CIRCUIT

LAYOUT OF THE COUPLER, ITS CONNECTION TO THE
AMPLIFIERS, AND THE COMPLEX TERMINATION
IMPEDANCE CIRCUIT

FIG. 13

TUNABLE COMPLEX IMPEDANCE TERMINATION

FIG. 14

0/90 DEGREE COUPLER WITH COMPLEX TERMINATION

CROSS REFERENCE TO RELATED APPLICATION

This application claims the benefit under 35 U.S.C. 119 from provisional U.S. patent application Ser. No. 62/164,122, filed on May 20, 2015. This application incorporates by reference the entire contents of provisional U.S. patent application Ser. No. 62/164,122.

TECHNICAL FIELD

The described embodiments relate to passive RF coupler circuits that drive mismatched loads, to amplifier circuits that include such RF coupler circuits, and to related structures and methods.

BACKGROUND INFORMATION

In order to amplify a Radio Frequency (RF) input signal, a single amplifier could be used. Such a single amplifier, however, may saturate at a certain output power level. In order to amplify the RF input signal more than this amount, two such amplifiers may be used. Each amplifier amplifies with a lower gain such that it does not saturate and so that its output signal does not exhibit unwanted distortion. The two resulting amplified signals as output by the two amplifiers are then combined to form a single higher power output signal that does not have the unwanted distortion.

Figure 1:
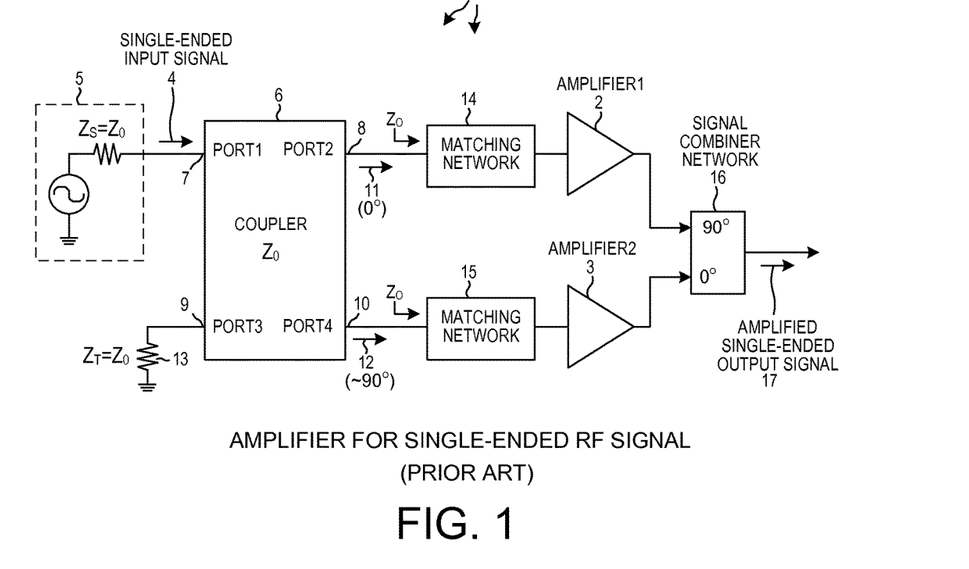
FIG. 1 (Prior Art) is a circuit diagram of an amplifier circuit that amplifies a single-ended RF signal.

FIG. 1 (Prior Art) is a diagram of a circuit 1 that includes two such amplifiers 2 and 3. The single-ended RF input signal 4 to be amplified is output by a RF input signal source 5, illustrated here in simplified symbolic form. The RF input signal 4 is supplied onto an input port 7 of a four-port passive coupler 6. The four-port 0/90 degree passive coupler 6 has four ports 7, 8, 9, and 10. The four-port passive coupler 6 splits the RF input signal 4 into a first signal 11 and a second signal 12. Port 9 is terminated by impedance 13. The second signal 12 output from port 10 is ninety degrees out of phase with respect to the first signal 11 output from port 8. The first signal 11 is supplied through a first impedance matching network 14 to the first amplifier 2. The second signal 12 is supplied through a second impedance matching network 15 to the second amplifier 3. The amplified signal as output by the second amplifier 3 is approximately ninety degrees out of phase with respect to the amplified signal as output by the first amplifier 2. A signal combiner 16 delays the amplified signal from the first amplifier 2 by ninety degrees so that it is in phase with the amplified signal as output from second amplifier 3. The signal combiner 16 combines the in-phase amplified signals so that a single high power single-ended output signal 17 is generated.

Figure 2:
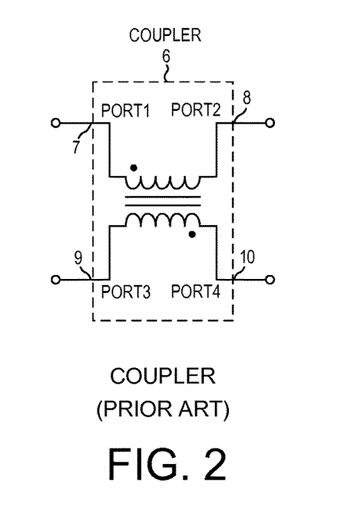
FIG. 2 (Prior Art) is a circuit diagram of the coupler of the amplifier circuit of FIG. 1.

FIG. 2 (Prior Art) is a diagram of the four-port 0/90 degree passive coupler 6 of the circuit 1 of FIG. 1.

Figure 3:
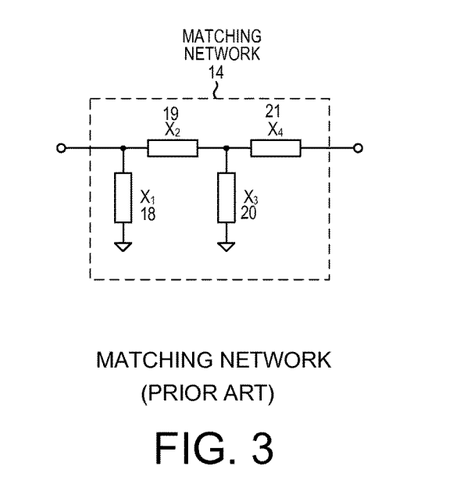
FIG. 3 (Prior Art) is a circuit diagram of a matching network of the amplifier circuit of FIG. 1.

FIG. 3 (Prior Art) is a diagram of the matching network 14 of the circuit 1 of FIG. 1. The matching network 14 includes four impedances 18, 19, 20 and 21. The two matching networks 14 and 15 are of identical construction. The output impedances of the output ports of the coupler 6 are relatively small, whereas the input impedances of the amplifiers 2 and 3 are relatively large. The two output ports 8 and 9 of the coupler 6 are loaded by the matching networks 14 and 15 in a particular way so that the first and second signals 11 and 12 have substantially equal signal amplitudes and so that they have the required ninety degrees phase difference, one with respect to the other. In one example, the coupler 6 requires that all four ports be terminated with the characteristic impedance $Z_0$ of the coupler in order for the second signal 12 as output via port 10 to have the desired ninety degree phase difference with respect to the first signal 12 as output via port 8. Accordingly, in the circuit of FIG. 1, all four ports 7-10 are terminated with load impedances of $Z_0$.

Figure 4:
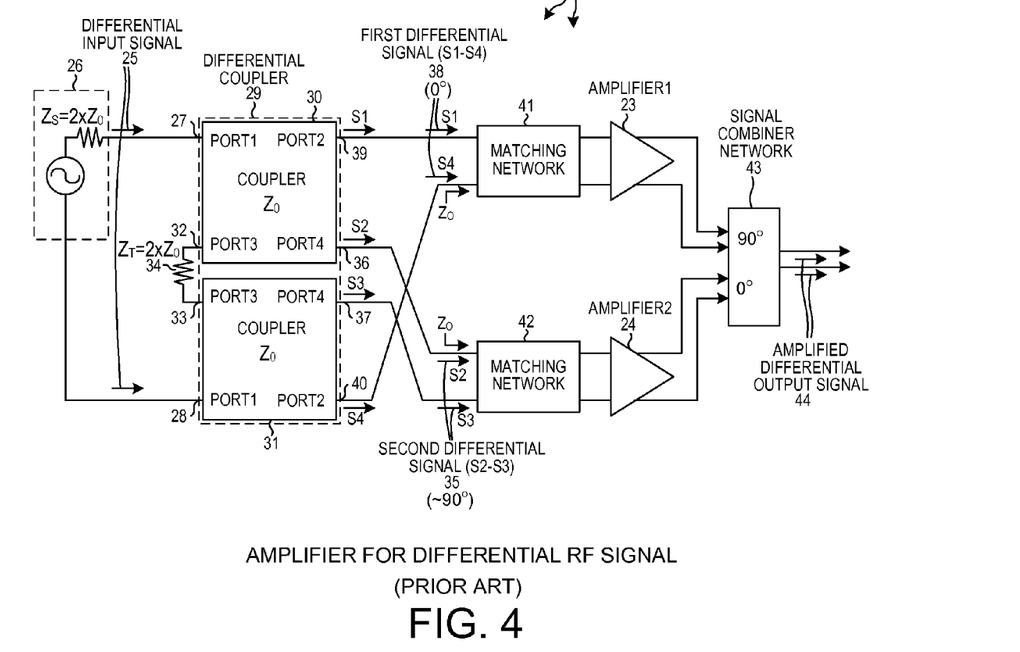
FIG. 4 (Prior Art) is a circuit diagram an amplifier circuit that amplifies a differential RF signal.

FIG. 4 (Prior Art) is a diagram of a circuit 22 that uses two differential amplifiers 23 and 24 to amplify an RF input signal 25. Whereas the RF input signal 4 of the circuit of FIG. 1 is a single-ended signal, the RF input signal 25 of the circuit of FIG. 4 is a differential signal. A signal source 26, illustrated here in symbolic form, supplies the differential RF input signal 25 onto a differential input port 27 and 28 of a four-port 0/90 degree differential coupler 29. The four-port 0/90 degree differential coupler 29 in turn is made up of two couplers 30 and 31. The isolated port 32 and 33 of the differential coupler 29 is terminated by a terminating impedance 34. The second differential signal 35 as output from a second output port 36 and 37 of the differential coupler 29 is ninety degrees out of phase with respect to a first differential signal 38 as output from a first output port 39 and 40 of the differential coupler 29. The first differential signal 38 is supplied through a first matching network 41 to the first differential amplifier 23. The second differential signal 35 is supplied through a second matching network 42 to the second differential amplifier 24. A signal combiner 43 phase shifts the differential signal as output by the first amplifier 23 by ninety degrees and merges that phase-shifted signal with the differential signal as output by the second amplifier 24 so as to generate a single differential output signal 44.

Figure 5:
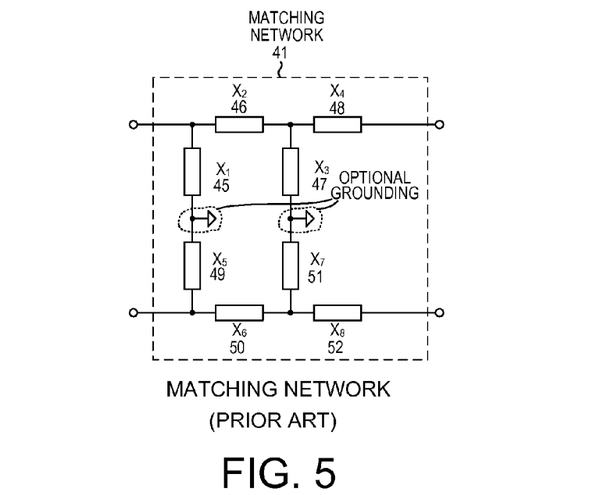
FIG. 5 (Prior Art) is a circuit diagram of a matching network of the amplifier circuit of FIG. 4.

FIG. 5 (Prior Art) is a diagram of the matching network 41 of the circuit of FIG. 4. The matching network 41 includes eight impedances 45-52. The output impedances of the two differential output ports of the differential coupler 29 are relatively small, whereas the input impedances of the two differential amplifiers 23 and 24 are relatively large. The two differential output ports of the differential coupler 29 are loaded by the matching networks 41 and 42 in a particular way so that the first and second differential signals 38 and 35 have substantially equal signal amplitudes and so that they have the required ninety degrees phase difference, one with respect to the other. In one example, the differential coupler 29 requires all four of its differential ports be terminated with the characteristic impedance $Z_0$ in order for the second differential signal 35 as output from the second differential output port to have the desired ninety degree phase difference with respect to the first signal 38 as output from the first differential output port. Accordingly, in the circuit of FIG. 4, all four differential ports of the differential coupler 29 are terminated with load impedances of $Z_O$.

SUMMARY

In an integrated circuit, a four-port 0/90 degree passive coupler is used as a signal splitter. A Radio Frequency (RF) input signal to be split is received on an input port of the coupler such that the coupler outputs a first output signal from a first output port of the coupler and such that the coupler outputs a second output signal from a second output of the coupler. The RF input signal is of frequency F, as are the first and second output signals as output by the coupler. Frequency F is greater than 500 MHz in one example. The phase of the second output signal has a relative phase with respect to the phase of the first output signal of approximately 90 degrees.

The first output port of the coupler is coupled to drive the first output signal to a first load. The first load may be an active circuit such as, for example, an amplifier. Alternatively the first load may be a passive component such as, for example, a mixer. The first output port of the coupler is not, however, impedance matched by any matching network to the first load. Rather, there is a substantial impedance mismatch at frequency F between the first output port of the coupler and the first load in that $0.3<|gamma1|<1.0$ at 5 GHz, where gamma1 is the reflection coefficient from the first output port of the coupler looking into a signal conductor or conductors that connect the first output port of the coupler to the first load.

Similarly, the second output port of the coupler is coupled to drive the second output signal to a second load. The second load may be an active circuit such as, for example, an amplifier. Alternatively the second load may be a passive component such as, for example, a mixer. The second output port of the coupler is not, however, impedance matched by any matching network to the second load. Rather, there is a substantial impedance mismatch at frequency F between the second output port of the coupler and the second load in that $0.3<|gamma2|<1.0$ at 5 GHz, where gamma2 is the reflection coefficient from the second output port of the coupler looking into a signal conductor or conductors that connect the second output port of the coupler to the second load.

Despite the impedance mismatch at frequency F between the first output port and the first load, and despite the impedance mismatch at frequency F between the second output port and the second load, the first and second output signals have a phase difference at frequency F in a range of from 88 degrees to 92 degrees (ideally the phase difference is 90 degrees) while exhibiting an amplitude imbalance that is less than 2 dB (ideally the two signals have identical amplitudes). This phase relationship and minimal amplitude imbalance between the first and second output signals is achieved by terminating the isolated port of the coupler with a novel complex termination impedance circuit, where the complex termination impedance circuit has a reactance at the frequency F, the absolute value of which is greater than two ohms. In some examples and embodiments, the reactance is a positive reactance. In other examples and embodiments, the reactance is a negative reactance.

In one example where the first and second loads are amplifiers, the first amplifier outputs an amplified version of the first output signal and supplies that signal to a first input port of a passive signal combiner, and the second amplifier outputs an amplified version of the second output signal and supplies that signal to a second input port of the passive signal combiner. The passive signal combiner phase-delays the signal received in its first input port by ninety degrees, and then power-combines the phase delayed signal with the signal received on its second input port, thereby generating and outputting a single higher-power output signal. The overall circuit including the coupler, the two amplifiers, and the signal combiner is an amplifier circuit that receives an RF input signal and outputs an amplified RF output signal. Due to the absence of matching networks between the coupler and the amplifiers, signal losses that would otherwise occur in such matching networks are avoided. In one specific example, without changing the design of the amplifiers, and without changing the design of the coupler, the overall amplifier circuit exhibits up to 2 dB more voltage gain due to the novel termination of the isolated port with a complex termination impedance and due to the lack of power consuming matching networks between the coupler and the amplifiers.

The value of the resistance of complex termination impedance circuit and the value of the reactance of the complex termination impedance circuit in one example are determined empirically by simulation. The circuit is simulated with a number of different values of resistances and inductances and capacitances, so that the circuit is simulated with the complex termination impedance circuit having different relative magnitudes of resistance and reactance, for both positive reactance values and negative reactance values. For each different set of resistance, inductance and capacitance values, the phase difference and amplitude imbalance between the first and second output signals is logged. Multiple different circuit topologies for the complex termination impedance circuit may also be simulated in this way, with the phase difference and amplitude imbalance between the first and second output signals being logged for each simulation. A circuit topology and an associated set of resistance, inductance and capacitance values is then selected, which when used as the complex termination impedance circuit was simulated to result in a phase difference as close to ninety degrees as possible while simultaneously exhibiting an amplitude imbalance of less than 2 dB. There may be multiple different complex termination impedance circuits that result in the first and second output signals having the desired phase and amplitude characteristics.

In a first embodiment, the RF input signal is a single-ended signal and the four ports of the coupler are single-ended ports. The first output signal that is output by the coupler is a single-ended output signal and the first amplifier is coupled by a first signal conductor to receive this first single-ended output signal. Similarly, the second output signal that is output by the coupler is a single-ended output signal and the second amplifier is coupled by a second signal conductor to receive this second single-ended output signal. In one specific example, the complex termination impedance circuit that terminates the isolated port of the coupler comprises an inductor coupled in series with a resistor. The inductor is disposed in a central area formed by two multi-turn windings of the coupler.

In a second embodiment, the RF input signal is a differential signal and the four ports of the coupler are differential ports. The coupler is a differential coupler. The first output signal that is output by the differential coupler is a differential output signal and the first amplifier is coupled by a first pair of signal conductors to receive this first differential output signal. Similarly, the second output signal that is output by the differential coupler is a differential output signal and the second amplifier is coupled by a second pair of signal conductors to receive this second differential output signal. In one specific example, the complex termination impedance circuit that terminates the isolated differential port of the differential coupler comprises a first inductor coupled in series with a first resistor, and a second inductor coupled in series with a second resistor. The first inductor is disposed in a central area formed by a first two multi-turn windings of the differential coupler, and the second inductor is disposed in a central area formed by a second two multi-turn windings of the differential coupler.

In another embodiment, an integrated circuit comprises a four-port passive coupler, a first amplifier, a first conductor, a second amplifier, a second conductor, a passive signal combiner, and a complex termination impedance circuit.

The four-port passive coupler has an input port, an isolated port, a first output port and a second output port. A single-ended input signal of a frequency F is received by the four-port passive coupler onto the input port, where frequency F is greater than 500 MHz. A first single-ended signal S1 of frequency F and phase φS1 is output from the first output port. A second single-ended signal S2 of frequency F and phase φS2 is output from the second output port. The signals S1 and S2 have an amplitude imbalance of less than 2 dB. The absolute value of the phase difference between φS1 and φS2 is in a range of between eighty-eight degrees and ninety degrees.

The first amplifier has an input port.

The first conductor couples the input port of the first amplifier to receive the signal S1 from the first output port of the four-port passive coupler. There is a substantial impedance mismatch between the first output port of the four-port passive coupler and the input port of the first amplifier in that 0.3<|gamma1|<1.0 at frequency F, where gamma1 is the reflection coefficient from the first output port looking into the first conductor.

The second amplifier has an input port.

The second conductor couples the input port of the second amplifier to receive the signal S2 from the second output port of the four-port passive coupler. There is a substantial impedance mismatch between the second output port of the four-port passive coupler and the input port of the second amplifier in that 0.3<|gamma2|<1.0 at frequency F, where gamma2 is the reflection coefficient from the second output port looking into the second conductor.

The passive signal combiner has a first input port, a second input port, and an output port. The first input port of the passive signal combiner is coupled to receive an amplified version of the signal S1 from an output lead of the first amplifier. The second input port of the passive signal combiner is coupled to receive an amplified version of the signal S2 from an output lead of the second amplifier. An output signal of frequency F is output by the passive signal combiner to the output port of the passive combiner.

The complex termination impedance circuit is coupled to terminate the isolated port of the four-port passive coupler. The complex termination impedance has a reactance of more than two ohms at frequency F.

In yet another embodiment, an integrated circuit comprises a different coupler, a first amplifier, a second amplifier, a first pair of conductors, a second pair of conductors, a passive signal combiner, and a complex termination impedance circuit.

The differential coupler has a differential input port, a differential isolated port, a first differential output port and a second differential output port. A differential input signal of a frequency F is received onto the differential input port.

The first amplifier has a differential input port. The first amplifier receives a first differential signal of phase φ1 from the first differential output port of the differential coupler and onto the differential input port of the first amplifier.

The second amplifier has a differential input port. The second amplifier receives a second differential signal of phase φ2 from the second differential output port of the differential coupler and onto the differential input port of the second amplifier. The first and second differential signals have an amplitude imbalance of less than 2 dB. The absolute difference between φ1 and φ2 is in a range of between eighty-eight degrees and ninety-two degrees.

The first pair of conductors couples the first differential output port of the differential coupler to the differential input port of the first amplifier. There is a substantial impedance mismatch between the first differential output port of the differential coupler and the differential input port of the first amplifier in that 0.3<|gamma1|<1.0 at frequency F, where gamma1 is the reflection coefficient from the first differential output port of the differential coupler looking into the first pair of conductors.

The second pair of conductors couples the second differential output port of the differential coupler to the differential input port of the second amplifier. There is a substantial impedance mismatch between the second differential output port of the differential coupler and the differential input port of the second amplifier in that 0.3<|gamma2|<1.0 at frequency F, where gamma2 is the reflection coefficient from the second differential output port of the differential coupler looking into the second pair of conductors.

The passive signal combiner receives an amplified version of the first differential signal from the first amplifier and receives an amplified version of the second differential signal from the second amplifier.

The complex termination impedance circuit is coupled to terminate the differential isolated port of the differential coupler. The complex termination impedance has a reactance of more than two ohms at frequency F. In one example, the reactance is a negative reactance. In another example, the reactance is a positive reactance.

In a specific example, the first pair of conductors comprises a first conductor and a second conductor. The first conductor of the first pair of conductors has a resistance between the differential coupler and the first amplifier that is less than two ohms. The first conductor of the first pair of conductors has a capacitance to signal ground that is less than twenty femtofarads. The second pair of conductors comprises a first conductor and a second conductor. The first conductor of the second pair of conductors has a resistance between the differential coupler and the second amplifier that is less than two ohms. The second conductor of the second pair of conductors has a capacitance to signal ground that is less than twenty femtofarads. There is no matching network in a signal path of the first differential signal from the first differential output port of the differential coupler to the differential input port of the first amplifier, and there is no matching network in a signal path of the second differential signal from the second output differential output port of the differential coupler to the differential input port of the second amplifier.

Further details and embodiments and methods are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to background examples and some embodiments of the invention, examples of which are illustrated in the accompanying drawings.

An RF transceiver integrated circuit includes a receive chain portion, a transmit chain portion, and local oscillator circuitry. The local oscillator circuitry supplies a local oscillator signal to a downconverter of the receive chain portion, and also supplies a local oscillator signal to an upconverter of the transmit chain portion. Information to be transmitted by the transmit chain portion is supplied in digital form from a digital baseband integrated circuit to a Digital-to-Analog Converter (DAC) of the transmit chain portion. The DAC converts the digital information into analog form. The resulting analog signal as output by the DAC is filtered by a baseband filter of the transmit chain portion. The resulting filtered analog signal is supplied to the upconverter of the transmit chain portion. The upconverter upconverts the analog signal in frequency, thereby generating an RF signal. The RF signal is supplied to a driver amplifier of the transmit chain portion. The driver amplifier in turn outputs an amplified version of the RF signal to a Power Amplifier (PA) of the transmit chain portion. The PA drives the RF signal through coupling and output filtering circuitry onto an antenna.

Figure 6:
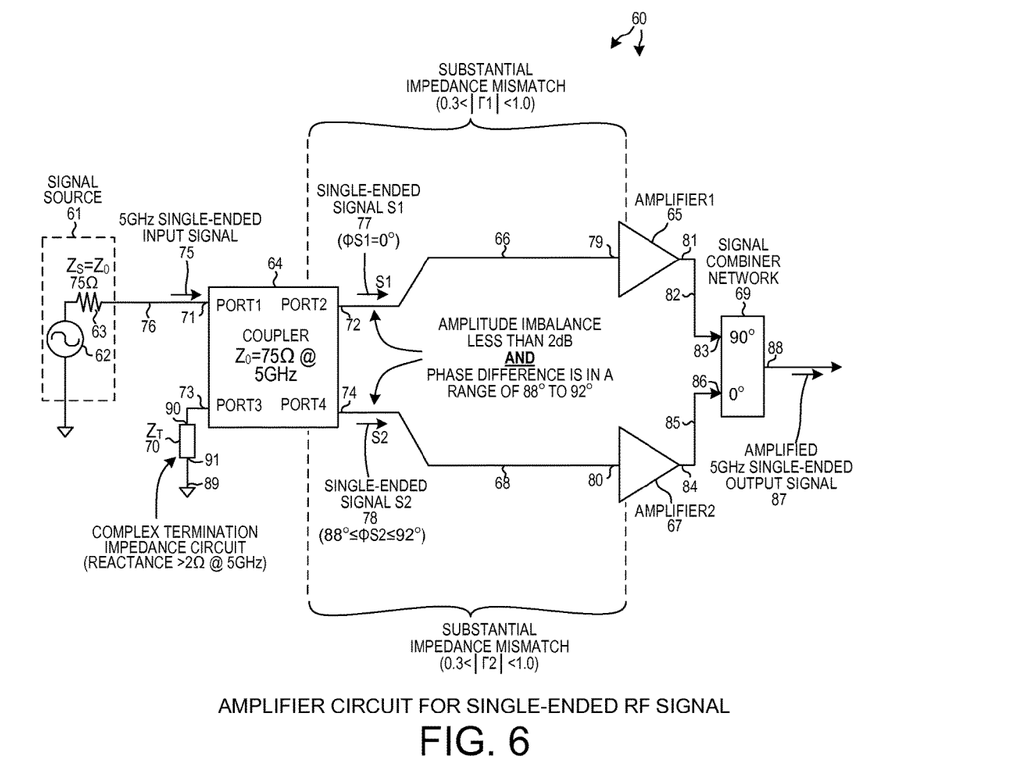
FIG. 6 is a circuit diagram of an amplifier circuit that amplifies a single-ended RF signal in accordance with a first novel aspect.

FIG. 6 is a circuit diagram of an amplifier circuit 60 for amplifying a single-ended signal in accordance with a first novel aspect. In one example, this circuit 60 is the input stage of the PA in the transmit chain portion of the RF transceiver integrated circuit. The circuit 60 is shown in FIG. 6 being driven by a signal source 61. The signal source 61 is shown in FIG. 6 in symbolic form as including an ideal AC voltage signal source 62 and a series output impedance 63. The circuit 60 includes a four-port 0/90 degree passive coupler 64, a first amplifier 65, a first conductor 66, a second amplifier 67, a second conductor 68, a signal combiner 69, and a complex termination impedance circuit 70. The four-port passive coupler 64 has four ports 71-74. Port 71 is a signal input port. Port 72 is a first signal output port. Port 74 is a second signal output port. Port 73 is an isolated port. A 5 GHz single-ended input signal 75 is output by the signal source 61 and is supplied across a metal signal conductor 76 onto the input port 71. The coupler 64 effectively splits the RF input signal, thereby outputting a first single-ended output signal S1 77 out of the first output port 72 and outputting a second single-ended output signal S2 78 out of the second output port 74.

The first signal S1 77 is supplied across the first signal conductor 66 from the first output port 72 of the coupler 64 to the input port 79 of the first amplifier 65. The input impedance of the first amplifier 65 is substantially greater than the output impedance of the output port 72 of the coupler. Unlike the prior art circuits of FIG. 1 and FIG. 4, there is no impedance matching network disposed in the signal path of the signal S1 between the output port 72 of the coupler and the input port 79 of the first amplifier. To the contrary, there is a substantial impedance mismatch of gamma1 ($\Gamma 1$), where gamma1 is in the range of 0.3<gamma1<1.0. In one specific example, the output impedance of the output port 72 at 5 GHz is approximately 150 ohms, whereas the input impedance of the input port 79 at 5 GHz is greater than 10 k ohms.

In similar fashion, the second signal S2 78 is supplied across the second signal conductor 68 from the second output port 74 of the coupler 64 to the input port 80 of the second amplifier 67. The input impedance of the second amplifier 67 is substantially greater than the output impedance of the output port 74 of the coupler. Unlike the prior art circuits of FIG. 1 and FIG. 4, there is no impedance matching network disposed in the signal path of the signal S2 between the output port 74 of the coupler and the input port 80 of the second amplifier. To the contrary, there is a substantial impedance mismatch of gamma2 ($\Gamma 2$), where gamma2 is in the range of 03<gamma2<1.0. In one specific example, the output impedance of the output port 74 at 5 GHz is approximately 150 ohms, whereas the input impedance of the input port 80 at 5 GHz is greater than 10 k ohms.

The second signal S2 is phase delayed with respect to the first signal S1 by a phase difference in a range of from 88 degrees to 92 degrees. The phase difference is ideally ninety degrees. In the diagram, φS1 is the phase of the first signal S1 and φS2 is the phase of the second signal S2.

In addition to the ninety-degree phase difference between the two signals S1 and S2, there is only a very small amplitude imbalance between the two signals S1 and S2. The amplitude imbalance between the two signals S1 and S2 is less than 2 dB.

The first signal S1 is amplified by the first amplifier 65 and the resulting amplified signal is output from the output port 81 of the first amplifier and across the signal conductor 82 to a first input port 83 of the signal combiner 69. The second signal S2 is amplified by the second amplifier 67 and the resulting amplified signal is output from the output port 84 of the second amplifier and across the signal conductor 85 to a second input port 86 of the signal combiner 69. The signal combiner 69 phase delays the signal on its first input port 83 by ninety degrees, and combines that phase-delayed signal with the signal received via its second input port 86. The powers of the two signals are combined. The resulting 5 GHz single-ended output signal 87, as output from the signal combiner 69 via its output port 88, has a combined power that is roughly the sum of the powers of the two signals received via ports 83 and 86.

The isolated port 73 of the four-port passive coupler 64 is terminated to ground and a ground conductor 89 by the complex termination impedance circuit 70. The impedance of the complex termination impedance circuit 70 is denoted $Z_T$. A first terminal 90 of the complex termination impedance circuit 70 is coupled to the isolated port 73 of the coupler. A second terminal 91 of the complex termination impedance circuit 70 is coupled to ground and the ground conductor 89. Unlike the prior art circuits of FIG. 1 and FIG. 4 where the impedances that terminate the isolated ports of the couplers in those circuits are all the same and are not complex, in the circuit 60 of FIG. 60 the impedance $Z_T$ of the complex termination impedance circuit 70 that terminates the isolated port 73 has a reactance at 5 GHz whose absolute value is greater than two ohms. Depending on other details of the particular example of the circuit 60, the reactance can be positive or negative. The absolute value of the reactance at the operating frequency of the circuit, however, is greater than two ohms.

Figure 7:
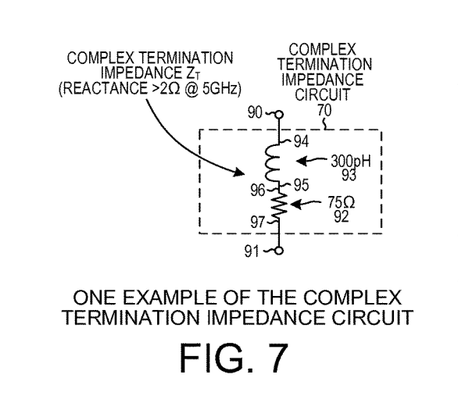
FIG. 7 is a circuit diagram of one example of the complex termination impedance circuit of the amplifier circuit of FIG. 6.

FIG. 7 is a circuit diagram of one example of the complex termination impedance circuit 70 of FIG. 6. The circuit 70 includes a resistor 92 and an inductor 93, that are coupled together in series as shown. A first end and terminal 94 of the inductor 93 is the same node as the first terminal 90 of the circuit 70. A second end and terminal 95 of the inductor 93 is coupled to a first end and terminal 96 of the resistor 92. A second end and terminal 97 of the resistor 92 is the same node as the second terminal 91 of the circuit 70.

In an empirical method, the values of the components in the complex termination impedance circuit 70, and the circuit topology of the complex termination impedance circuit 70, are determined by simulation. The layout of the coupler 64 is drawn or otherwise entered into an EM simulator (ElectroMagnetic simulator), and the simulator is used to obtain sixteen S-parameter values for the coupler. The S-parameter values are then used to make a model of the coupler 64 in a circuit simulator such as SPICE. The remainder of the circuit 60 is also modeled in SPICE. A resistance value close to the characteristic impedance of the coupler 64 is chosen for the resistance of resistor 92. Next, the inductance of inductor 93 is set, the overall circuit of FIG. 6 is simulated, and the phase difference between S1 and S2 is recorded as is the amplitude imbalance between S1 and S2. The value of the inductance of inductor 93 is then increased, and the circuit is resimulated, and the phase difference and amplitude imbalance is recorded. The value of the inductance is then increased again, and the circuit is resimulated again, and the phase difference and amplitude imbalance is recorded again. These simulation and data logging steps are repeated. Next, the resistance of the resistor 92 is changed, and the circuit is simulated again, once for each of the different inductance values of inductor 93. For each simulation, the phase difference and the amplitude imbalance is recorded. This process is repeated for multiple different resistance values, with some values being larger than the characteristic impedance of the coupler 64, and with other values being smaller than the characteristic impedance of the coupler 64. This overall simulation process is then repeated with the inductor 93 being replaced by a capacitor. Circuit operation is simulated for each resistance value, with each of a number of different capacitance values. After the data is taken, the resistance value and associated inductance or capacitance is identified that resulted in the phase difference being ninety degrees with the smallest amplitude imbalance. In the specific example of FIG. 6, an inductance value of 300 picohenries and a resistance value of 150 ohms was determined to result in the phase of the signal S2 78 having a ninety degree phase difference with respect to the phase of the signal S1 77 while the amplitude imbalance between the two signals S1 and S2 was less than 2 dB.

Of importance, the phase difference between signals S1 and S2 being the range of 88 degrees to 92 degrees and the amplitude imbalance between signals S1 and S2 being less than 2 dB are both simultaneously achieved without there being any matching network present in the signal path of the first signal S1 between the first output port 72 of coupler 64 and the input port 79 of the first amplifier 65, and without there being any matching network present in the signal path of the second signal S2 between the second output port 74 of coupler 64 and the input port 80 of the second amplifier 67. Signals losses in the signals S1 and S2 that would otherwise occur in such matching networks do not occur in the circuit of FIG. 6. Moreover, semiconductor die area that would otherwise be occupied by matching network circuitry is freed up and made available for other purposes.

Figure 8:
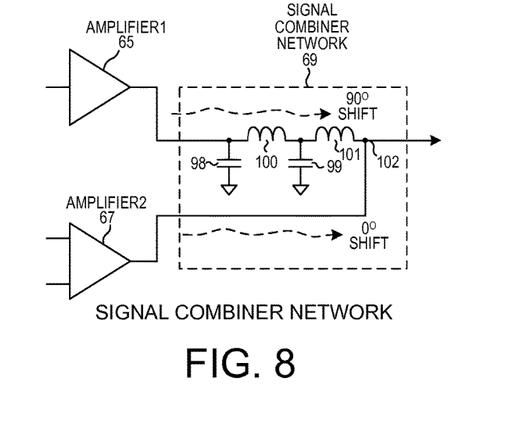
FIG. 8 is a circuit diagram of one example of the signal combiner of the amplifier circuit of FIG. 6.

FIG. 8 is a circuit diagram that illustrates one example of the signal combiner 69 of the circuit 60 of FIG. 6. The signal combiner 69 includes two capacitors 98 and 99 and two inductors 100 and 101 interconnected as shown. The amplified version of the signal S1 is phase delayed by ninety degrees, and the resulting phase-delayed signal is combined at node 102 with the signal S2. Because the two amplified signals are in-phase at node 102, the powers of the two signals effectively sum.

Figure 9:
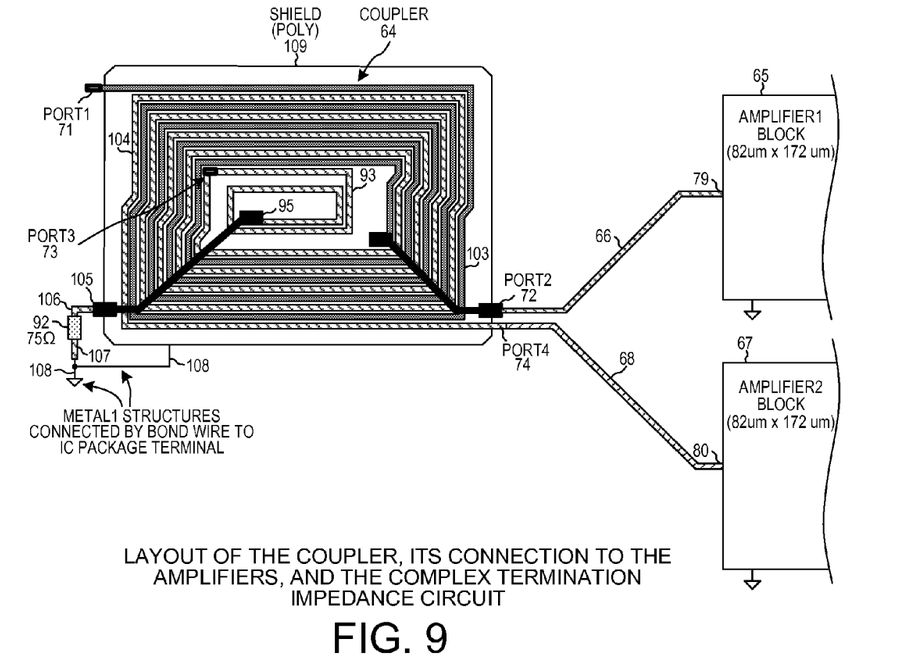
FIG. 9 is a layout diagram of the coupler, its connection to the amplifiers, and the complex termination impedance circuit of an example of the amplifier circuit of FIG. 6.

FIG. 9 is a simplified layout diagram that illustrates a layout of an example of the circuit 60 of FIG. 6. The four-port 0/90 degree passive coupler 64 includes a first winding 103 and a second winding 104 that is coupled to the first winding. The two windings 103 and 104 loop around and surround a central area. The characteristic impedance of the coupler 64 is 75 ohms. The 300 picofarad inductor 93 of the complex termination impedance circuit 70 is disposed in this central area. The isolated port 73 (PORT3) of the coupler 64 is a portion of a conductor that on one side is the second winding 104 of the coupler and that on the other side is the inductor 93 of the complex termination impedance circuit. The isolated port 73 in this case is just a part of this conductor at the point indicated in FIG. 9. The first and second windings 103 and 104, each of which is about five turns, are formed of metal of the same metal layer of the semiconductor integrated circuit. The other end 95 of the inductor 93 is connected by an ascending vertical via, an outwardly extending length of bridging metal conductor, a descending vertical via at location 105, and an amount of lower level metal conductor 106 to a polysilicon feature. In the illustrated of FIG. 9, the bridging strip of metal is shown in darkened form. The polysilicon feature is the 75 ohms resistor 92 of the complex termination impedance circuit 70. The other end of the resistor 92 is coupled by metal conductor 107 to ground or to a ground conductor. Reference numeral 108 identifies metal structures that connect to a bond pad of the integrated circuit. The bond pad is in turn connected by a bond wire to a ground terminal of the integrated circuit package. The first and second windings 103 and 104 are disposed over a grounded shield 109 of polysilicon. The shield is a rectangular plate of polysilicon. The first output port 72 of the coupler 64 is connected via an outwardly-extending strip of metal conductor to the input port 79 of the first amplifier 65. In the present example, this strip of metal 66 is approximately 200 microns long. It has a uniform thickness of about 3 microns and a uniform width of about 3 microns. About five to six microns of silicon oxide insulator separates the bottom of this strip of metal 66 from the underlying circuits and silicon. This strip of metal has a series resistance (measured between the output port 72 of the coupler and the input port 79 of the first amplifier 65) of less than two ohms. The strip of metal does not form a turn or a loop. The strip of metal forms no sidewall capacitors and exhibits a capacitance of less than twenty femtofarads between the strip and ground. The first amplifier 65 is disposed in a rectangular area that is laterally displaced from the coupler 64 as illustrated in the diagram. In the present example, the input port 79 is a gate of a field effect transistor of the first amplifier. The second conductor 68 is a similar 200 micron long strip of metal that extends from the second output port 74 of the coupler to the input port 80 of the second amplifier 67. Note that there is no matching network between the coupler 64 and the two amplifiers 65 and 67. In one example, the conductors 66 and 68 cross over other circuitry (not shown) that is disposed between the coupler 64 and the two amplifiers.

Figure 10:
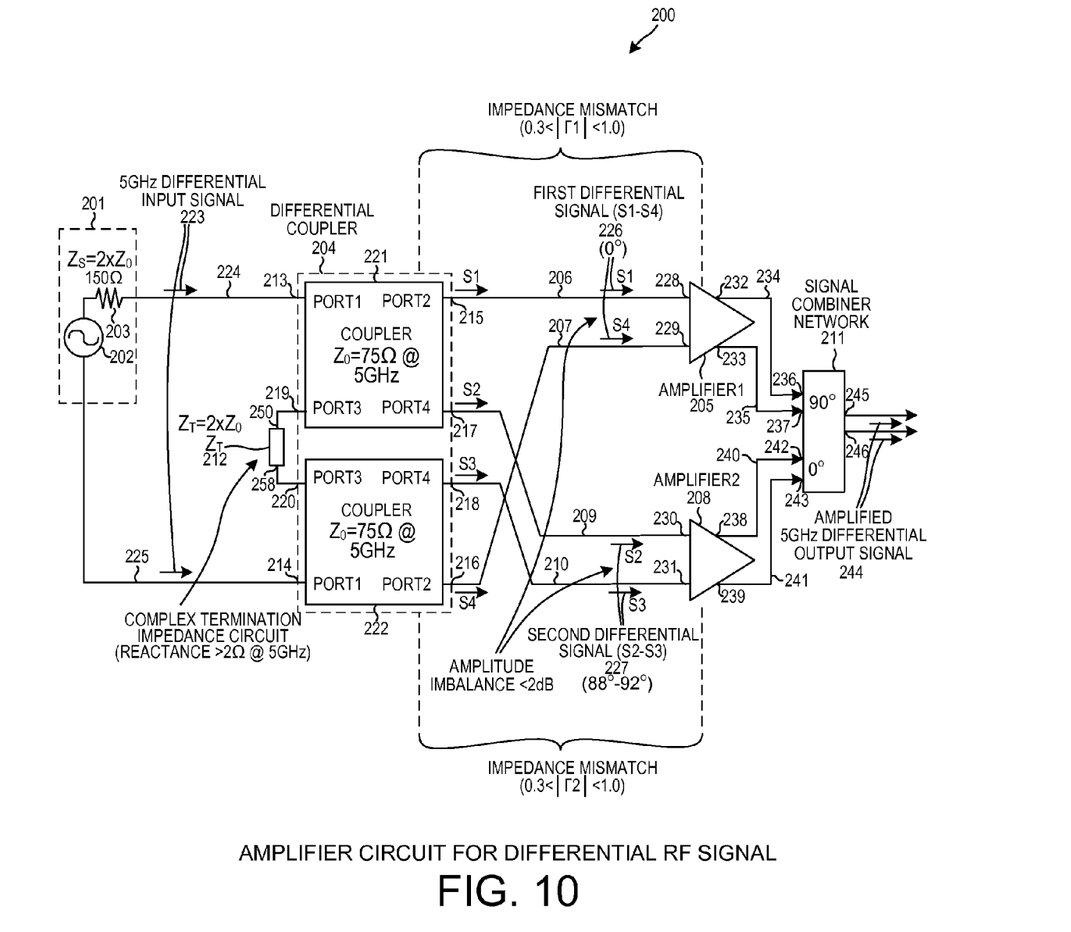
FIG. 10 is a circuit diagram of an amplifier circuit that amplifies a differential RF signal in accordance with a second novel aspect.

FIG. 10 is a circuit diagram of an amplifier circuit 200 for amplifying a differential signal in accordance with a second novel aspect. In one example, this circuit 200 is the input stage of the PA in the transmit chain portion of the RF transceiver integrated circuit. The circuit 200 is shown in FIG. 10 being driven by a signal source 201. The signal source 201 is shown in FIG. 10 in symbolic form as including an ideal AC voltage signal source 202 and a series output impedance 203. The circuit 200 includes a four-port 0/90 degree passive differential coupler 204, a first differential amplifier 205, a first pair of conductors 206 and 207, a second differential amplifier 208, a second pair of conductors 209 and 210, a signal combiner 211, and a complex termination impedance circuit 212. The four-port 0/90 degree passive coupler 204 has four differential ports. The first port, referred to here as the input port, is denoted by reference numerals 213 and 214. The second port, referred to here as the first output port, is denoted by reference numerals 215 and 216. The third port, referred to here as the second output port, is denoted by reference numerals 217 and 218. The fourth port, referred to here as the isolated port, is denoted by reference numerals 219 and 220. The differential coupler 204 actually includes a first four-port coupler 221 and a second four-port coupler 222 as shown in FIG. 10. A 5 GHz differential input signal 223 is output by the signal source 201 and is supplied across metal signal conductors 224 and 225 onto the differential input port 213 and 214 of the differential coupler 204. The differential coupler 204 splits the RF input signal, thereby outputting a first differential output signal 226 out of the first output port 215 and 216 and outputting a second differential output signal 227 out of the second output port 217 and 218.

A signal component S1 of the first differential signal 226 is communicated from output port or lead 215 of the differential coupler 204 and across metal signal conductor 206 to a first input lead 228 of the first differential amplifier 205. A signal component S4 of the first differential signal 226 is communicated from output port or lead 216 of the differential coupler 204 and across metal signal conductor 207 to a second input lead 229 of the first differential amplifier 205. The first differential signal 226 is the difference between the two signal components S1 and S4.

A signal component S2 of the second differential signal 227 is communicated from output port or lead 217 of the differential coupler 204 and across metal signal conductor 209 to a first input lead 230 of the second differential amplifier 208. A signal component S3 of the second differential signal 227 is communicated from output port or lead 218 of the differential coupler 204 and across metal signal conductor 210 to a second input lead 231 of the second differential amplifier 208. The second differential signal 227 is the difference between the two signal components S2 and S3.

At 5 GHz, the absolute value of the difference in phase between the phase $\phi 1$ of the first differential signal 226 and the phase $\phi 2$ of the second differential signal 227 is in the range of between eighty-eight degrees and ninety-two degrees. Ideally, the phase $\phi 2$ is delayed ninety degrees with respect to the phase $\phi 1$. In addition to this ninety-degree phase relationship, the amplitude imbalance between the first and second differential output signals 226 and 227 is less than 2 dB.

Of importance, there is no matching network in the signal path of the first differential signal 226 from the first differential output port 215 and 216 to the input port 228 and 229 of the first differential amplifier 205. There is a substantial impedance mismatch between the first differential output port 215 and 216 of the differential coupler 204 and the differential input port 228 and 229 of the first amplifier 205 in that 0.3<|gamma1|<1.0 at 5 GHz, where gamma1 (gamma1 may also be denoted $\lceil 1 \rceil$) is the reflection coefficient from the first differential output port 215 and 216 of the differential coupler looking into the first pair of conductors 206 and 207.

Similarly, there is no matching network in the signal path of the second differential signal 227 from the second differential output port 217 and 218 to the input port 230 and 231 of the second differential amplifier 208. There is a substantial impedance mismatch between the second differential output port 217 and 218 of the differential coupler 204 and the differential input port 230 and 231 of the second amplifier 208 in that 0.3<|gamma2|<1.0 at 5 GHz, where gamma2 (gamma2 may also be denoted $\lceil 2 \rceil$) is the reflection coefficient from the second differential output port 217 and 218 of the differential coupler looking into the second pair of conductors 209 and 210.

The first differential amplifier 205 outputs an amplified version of the first differential output signal out of output leads 232 and 233, and supplies that amplified signal across signal conductors 234 and 235 to the first differential input port 236 and 237 of the signal combiner 211. The second differential amplifier 208 outputs an amplified version of the second differential output signal out of output leads 238 and 239, and supplies that amplified signal across signal conductors 240 and 241 to the second differential input port 242 and 243 of the signal combiner 211. The signal combiner 211 delays the signal received on the first port 236 and 237 by ninety degrees, and combines this phase-delayed signal with the signal received on the second port 242 and 243, thereby generating the 5 GHz amplified differential output signal 244. The 5 GHz amplified differential output signal 244 is output from the output port 245 and 246 of the signal combiner 211.

The complex termination impedance circuit 212 that terminates the isolated port 219 and 220 of the differential coupler 204 whose absolute value at 5 GHz is greater than two ohms. Depending on other details of the particular example of the circuit 200, the reactance can be a positive reactance or a negative reactance. The absolute value of the reactance at the operating frequency of the circuit, however, is greater than two ohms.

Figure 11:
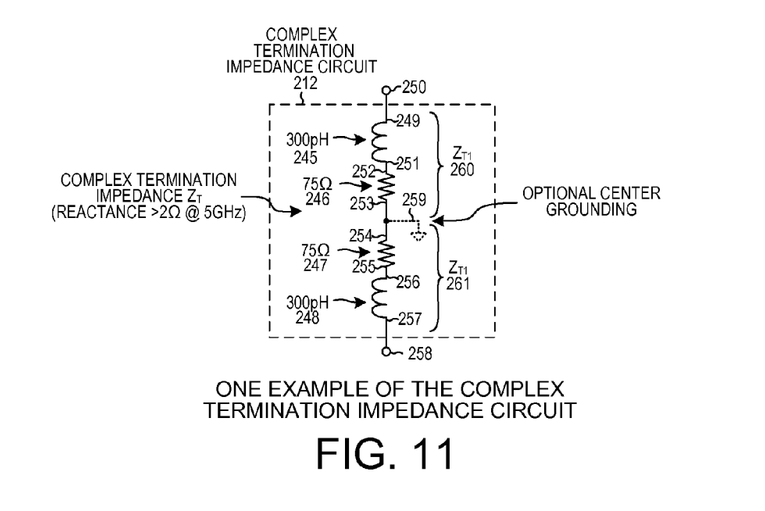
FIG. 11 is a circuit diagram of one example of the complex termination impedance circuit of the amplifier circuit of FIG. 10.

FIG. 11 is a circuit diagram of one specific example of the complex termination impedance circuit 212. The circuit 212 includes a first inductor 245, a first resistor 246, a second resistor 247, and a second inductor 248, that are all coupled together in series as shown. A first end and terminal 249 of the first inductor 245 is the same node as the first terminal 250 of the circuit 212. This first terminal 250 of the circuit 212 is coupled to lead 219 of the differential coupler 204. A second end and terminal 251 of the first inductor 245 is coupled to a first end and terminal 252 of the first resistor 246. A second end and terminal 253 of the first resistor 246 is coupled to a second end and terminal 254 of the second resistor 247. A first end and terminal 255 of the second resistor 247 is coupled to a second end and terminal 256 of the second inductor 248. A first end and terminal 257 of the second inductor 248 is the same node as the second terminal 258 of the complex termination impedance circuit 212.

The overall complex termination impedance circuit 212 comprises a first two-terminal complex termination impedance circuit 260 that terminates the port 219 of the differential coupler 204, and a second two-terminal complex termination impedance circuit 261 that terminates the port 220 of the differential coupler 204. In the example of FIG. 11, the first and second two-terminal complex termination impedance circuits 260 and 261 are coupled together in series across the differential isolated port 219 and 220 of the differential coupler 204. The node at the second end and terminal 253 of the first resistor 246 and the second end and terminal 254 of the second resistor 247 may optionally be connected to a ground conductor 259 as illustrated in FIG. 11.

Figure 12:
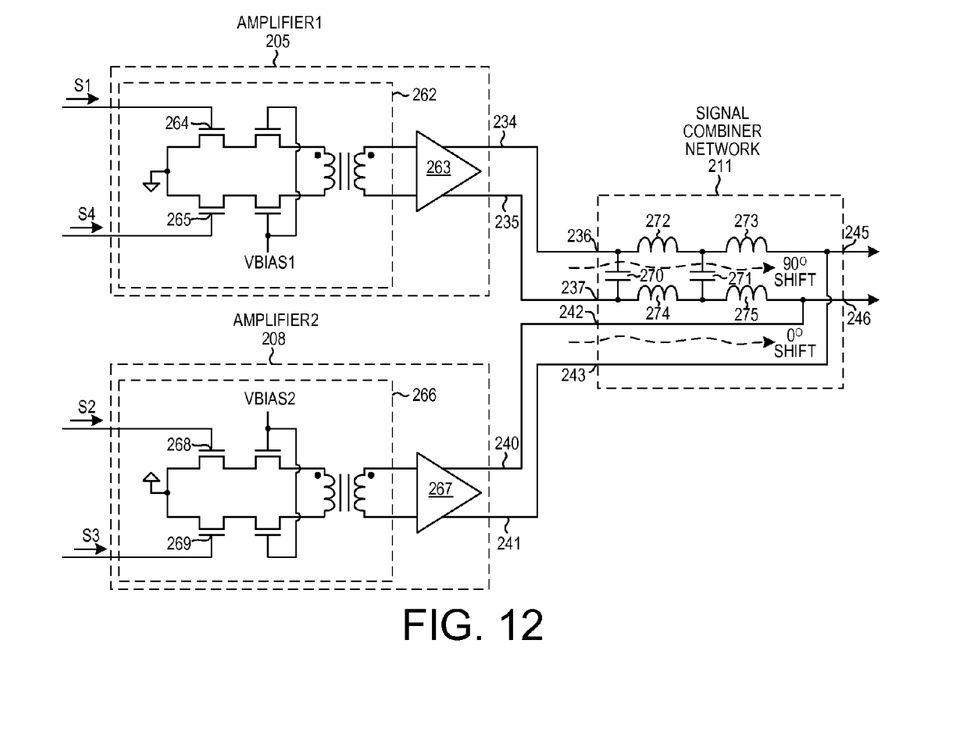
FIG. 12 is a circuit diagram of one example of the signal combiner of the amplifier circuit of FIG. 11.

FIG. 12 is a circuit diagram that shows detail of the first differential amplifier 205, of the second differential amplifier 208, and of the signal combiner 211. The first amplifier 205 includes a first stage 262 and a second stage 263. The input port 228 and 229 of the first amplifier 205 as illustrated in FIG. 10 is the gates 264 and 265 of transistors in the first stage 262 in FIG. 12. The second amplifier 208 includes a first stage 266 and a second stage 267. The input port 230 and 231 of the second amplifier 208 as illustrated in FIG. 10 is the gates 268 and 269 of transistors in the first stage 266 in FIG. 12. The signal combiner 211, which in this case is a differential signal combiner, includes two capacitors 270 and 271 and four inductors 272-275 interconnected as shown in FIG. 12.

In an empirical method, the values of the components in the complex termination impedance circuit 212, and the circuit topology of the complex termination impedance circuit 212, are determined by simulation. The layout of the coupler 204 is drawn or otherwise entered into an EM simulator (ElectroMagnetic simulator), and the simulator is used to obtain sixty-four S-parameter values for the coupler 204. The sixtyfour S-parameter values are then used to make a model of the coupler 204 in a circuit simulator such as SPICE. The remainder of the circuit 200 is also modeled in SPICE. A resistance value close to the characteristic impedance of the coupler 204 is chosen for the resistances of resistors 246 and 247. Next, the inductances of inductors 245 and 248 are set, the overall circuit 200 of FIG. 10 is simulated, and the phase difference between the first and second differential signals 226 and 227 is recorded as is the amplitude imbalance between the signals 226 and 227. The value of the inductances of inductors 245 and 248 are then increased, and the circuit is resimulated, and the phase difference and amplitude imbalance is recorded. The value of the inductance is then increased again, and the circuit is resimulated again, and the phase difference and amplitude imbalance is recorded again. Next, the resistances of the resistors 246 and 247 are changed, and the circuit is simulated again, once for each of the different inductance values of inductors 246 and 247. For each simulation, the phase difference and the amplitude imbalance is recorded. This process is repeated for multiple different resistance values, with some resistance values being larger than the characteristic impedance of the coupler, and with other resistance values being smaller than the characteristic impedance of the coupler. This overall simulation process is then repeated with the inductors 245 and 248 being replaced by capacitors. Circuit operation is simulated for each resistance value, with each of a number of different capacitance values. Multiple different circuit topologies for the complex termination impedance circuit may also be simulated in this way, with the phase difference and amplitude imbalance between the first and second output signals being logged for each simulation. After the data is taken, the circuit topology and set of component values is identified that was simulated to result in the phase difference between signals 226 and 227 being ninety degrees with the smallest amplitude imbalance between signals 226 and 227. In the specific example of FIG. 10, fixing the inductance values of inductors 245 and 248 at 300 picohenries and fixing the resistance values of resistors 246 and 247 at 150 ohms was determined to result in a ninety degree phase difference between the phase of signal 226 and the phase of signal 227 while the amplitude imbalance between the two signals was less than 2 dB.

Figure 13:
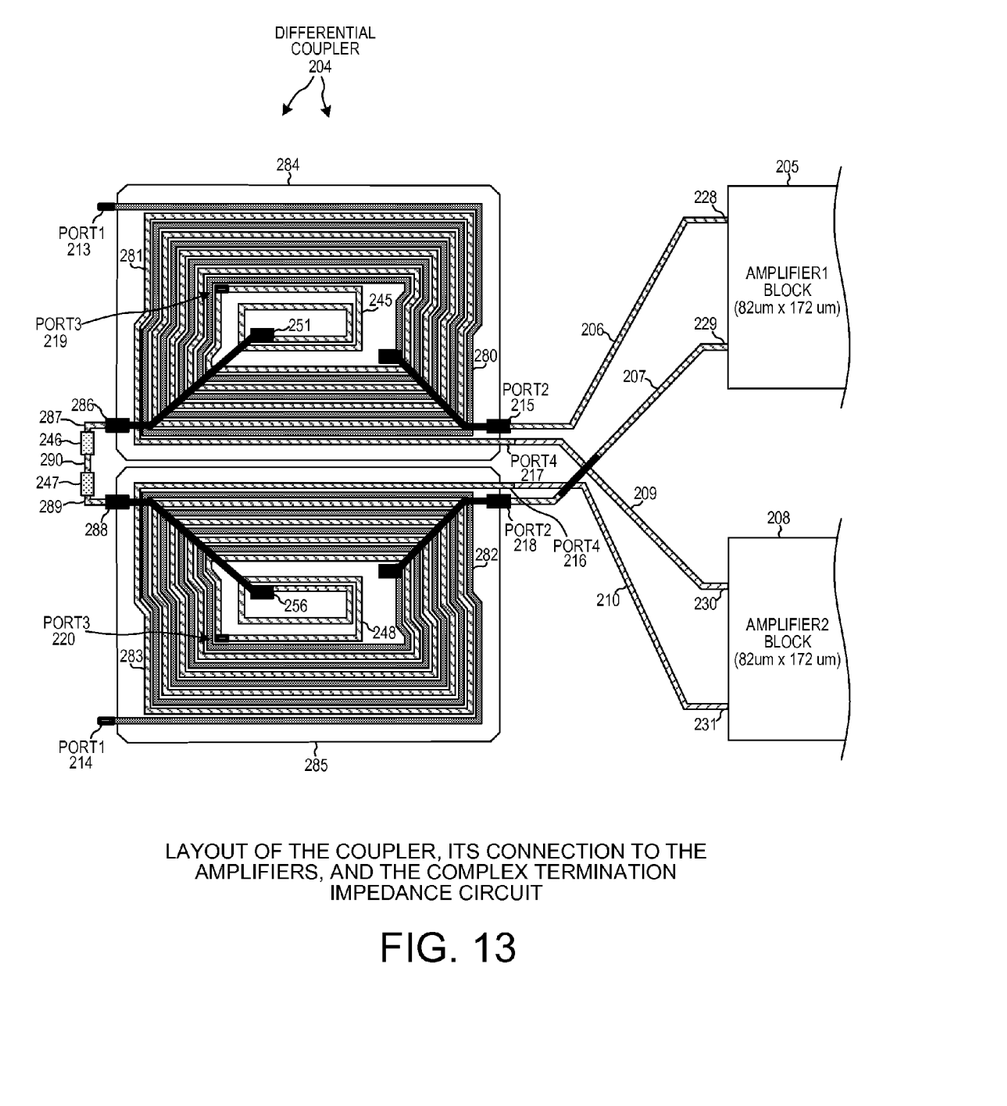
FIG. 13 is a layout diagram of the coupler, its connection to the amplifiers, and the complex termination impedance circuit of an example of the amplifier circuit of FIG. 11.

FIG. 13 is a simplified layout diagram that illustrates a layout of an example of the circuit 200 of FIG. 10. The four-port 0/90 degree passive differential coupler 204 includes four multi-turn windings 280-283. Multi-turn windings 280 and 281 are magnetically coupled to each other, and are disposed over a first shielded rectangle 284 of grounded polysilicon. Multi-turn windings 282 and 283 are magnetically coupled to each other, and are disposed over a second shielded rectangle 285 of grounded polysilicon. The two windings 280 and 281 loop around and surround a first central area. The inductor 245 of the complex termination impedance circuit 212 is disposed in this first central area. Windings 282 and 283 loop around and surround a second central area. The inductor 248 of the complex termination impedance circuit 212 is disposed in this second central area. One end of the first inductor 245 is connected to the isolated port 219, whereas the other end of the first inductor 245 is connected by an ascending vertical via, an outwardly extending length of bridging metal conductor, a descending vertical via at location 286, and an amount of lower level metal conductor 287 to a polysilicon feature. In the illustrated of FIG. 13, this bridging strip of metal is shown in darkened form. The polysilicon feature is the first resistor 246 of the complex termination impedance circuit 212. Likewise, one end of the second inductor 248 is connected to the isolated port 220, whereas the other end of the second inductor 248 is connected by an ascending vertical via, an outwardly extending length of bridging metal conductor, a descending vertical via at location 288, and an amount of lower level metal conductor 289 to a polysilicon feature. In the illustrated of FIG. 13, this bridging strip of metal is shown in darkened form. The polysilicon feature is the second resistor 247 of the complex termination impedance circuit 212. The other end of the second resistor 247 is coupled by metal conductor 290 to resistor 246.

Port 215 of the differential coupler is connected via an outwardly-extending strip of metal 206 to the input port 228 of the first amplifier 205; port 218 of the differential coupler is connected via an outwardly-extending strip of metal 207 to the input port 229 of the first amplifier 205; port 217 of the differential coupler is connected via an outwardly-extending strip of metal 209 to the input port 230 of the second amplifier 208, and port 216 of the differential coupler is connected via an outwardly-extending strip of metal 210 to the input port 231 of the second amplifier 208. In the present example, each of these strips is approximately 200 microns long. It has a uniform thickness of about 3 microns and a uniform width of about 3 microns. About five to six microns of silicon oxide insulator separates the bottom of the strip of metal from the underlying circuits and silicon. Strip 207 has a bridging portion that bridges up and over strips 209 and 210. Each strip of metal has a series resistance (measured from the appropriate port of the differential coupler to the input of the appropriate amplifier) of less than two ohms. The strip of metal does not form a complete turn or loop. The strip of metal forms no sidewall capacitors and exhibits a capacitance of less than twenty femtofarads between the strip and ground. The first differential amplifier 205 is disposed in a rectangular area that is laterally displaced from the differential coupler 204 as illustrated in the diagram. In the present example, each of the input ports 228, 229, 230 and 231 is a gate of a field effect transistor. The output impedance of the differential coupler 204 at each of its output ports is about 150 ohms at 5 GHz, whereas the input impedances of the differential amplifiers 205 and 206 at the amplifier inputs is greater than 2 k ohms at 5 GHz. Despite this impedance mismatch, there is no matching network between the coupler 204 and the two differential amplifiers 205 and 208. In one example, the metal strip conductors 206, 207, 209 and 210 cross over other circuitry (not shown) that is disposed between the differential coupler 204 and the two amplifiers 205 and 208.

Although certain specific embodiments are described above for instructional purposes, the teachings of this patent document have general applicability and are not limited to the specific embodiments described above. Although examples of couplers involving windings are set forth above, the coupler can be another type of coupler such as, for example, a branch-line coupler. The coupler complex termination technique that avoids the use of matching networks is not limited to use in an amplifier circuit, but rather is of general applicability. The loads that are driven by the coupler need not be amplifiers or even active circuits, but rather may be other signal receiving circuits and components. In one example, the coupler drives a first signal to an I mixer circuit, and drives a second signal to a Q mixer circuit. The complex termination impedance circuit need not have a circuit topology as set forth above, but rather may have another circuit topology.

Figure 14:
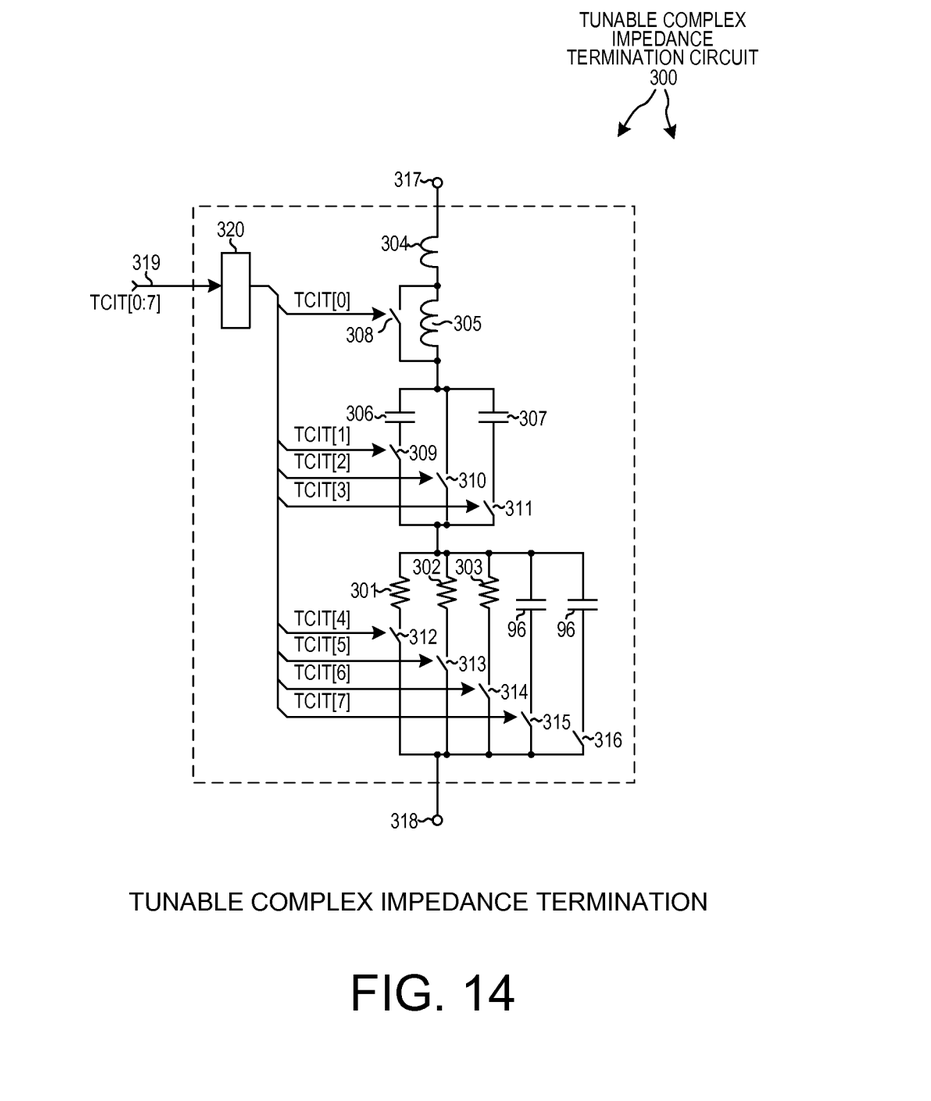
FIG. 14 is a circuit diagram of a tunable complex impedance circuit.

In one example shown in FIG. 14, the complex termination impedance circuit is a tunable complex impedance circuit 300 having a tunable resistance and/or a tunable inductance and/or a tunable capacitance. The complex impedance is present between terminals 317 and 318. Resistors 301-303, inductors 304-305, and capacitors 306-307 can be programmably switched into, and out of, the tunable complex termination impedance circuit, by switches 308-316. These switches 308-316 may be transistors that are controlled to be on or off by multiple bits of digital tuning information TCIT[0:7]. Multiple bits of digital tuning information TCIT[0:7] for controlling these switch transistors are, in one circuit, received via bus conductors 319 and are stored in a writable multi-bit digital register 320 in the same integrated circuit of which the coupler is a part. By changing the values stored in the multi-bit register 320, various ones of the circuit components (resistors, capacitor, inductors) can be switched into and/or out of the complex termination impedance circuit that terminates the isolated port or ports of the amplifier circuit. In this way, the reactance component of the impedance can be changed and tuned separately and independently of the resistance component of the impedance. In one example, the impedance of the tunable complex termination impedance circuit is adjusted to correct for phase errors exhibited in production integrated circuits where the phase errors are due to inaccurate simulation models or are due to variability in the electrical characteristics of circuit components that result from manufacturing variabilities in the production of the integrated circuits. In another example, the termination impedance of the tunable complex termination impedance circuit is adjusted during integrated circuit operation to compensate for impedance changes in the circuitry due to temperature changes as the circuit operates, where the temperature-caused changes would otherwise cause unacceptable phase and/or amplitude imbalances at the output ports of the coupler.

In another example, tunability is achieved using OTP (One Time Programmable) elements to switch in selected circuit components after integrated circuit fabrication. In another example, the tunable complex termination impedance circuit is not tunable in the field by turning on and off switches, but rather the integrated circuit has extra components that can be patched into and out the complex termination impedance circuit using just minor metal mask changes. The ultimate integrated circuit may therefore have an extra component that is not coupled to be a part of the complex termination impedance circuit, but that is disposed on the integrated circuit proximate to the other components of the complex termination impedance circuit so that the extra component can easily be patched into the complex termination impedance circuit by a minor metal layer patch, without making any other mask changes. Some copies of the integrated circuit have the extra component patched into the complex termination impedance structure whereas other copies of the integrated circuit do not have the extra component patched into the complex termination impedance structure. Although amplifier circuits are set forth above that split and amplify and combine 5 GHz signals, it is understood that these circuits are just examples. The amplifier circuits are modifiable using the techniques set forth above to split and amplify and combine signals of other frequencies.

Accordingly, various modifications, adaptations, and combinations of various features of the described embodiments can be practiced without departing from the scope of the invention as set forth in the claims.

What is claimed is:

1. An integrated circuit comprising:
    a four-port passive coupler having an input port, an isolated port, a first output port and a second output port, wherein an input signal of a frequency F is received by the four-port passive coupler onto the input port, wherein the frequency F is greater than 500 MHz, wherein a first signal S1 of the frequency F and a phase ΦS1 is output from the first output port, wherein a second signal S2 of the frequency F and a phase ΦS2 is output from the second output port, wherein the signals S1 and S2 have an amplitude imbalance of less than 2 dB, and wherein the absolute value of the phase difference between ΦS1 and ΦS2 is in a range of between eighty-eight degrees and ninety degrees;
    a first load having an input port, wherein the input port of the first load is coupled to receive the signal S1 from the first output port of the four-port passive coupler, wherein there is a substantial impedance mismatch between the first output port of the four-port passive coupler and the input port of the first load in that 0.3<|gamma1|<1.0 at the frequency F, where gamma1 is the reflection coefficient from the first output port looking out to the first load;
    a second load having an input port, wherein the input port of the second load is coupled to receive the signal S2 from the second output port of the four-port passive coupler, wherein there is a substantial impedance mismatch between the second output port of the four-port passive coupler and the input port of the second load in that 0.3<|gamma2|<1.0 at the frequency F, where gamma2 is the reflection coefficient from the second output port looking out to the second load; and a complex termination impedance circuit coupled to terminate the isolated port of the four-port passive coupler, wherein the complex termination impedance has a reactance, and wherein the absolute value of the reactance is more than two ohms at the frequency F.

2. The integrated circuit of claim 1, wherein the reactance is taken from the group consisting of: a positive reactance, and a negative reactance.

3. The integrated circuit of claim 1, wherein each of the first and second loads is taken from the group consisting of: an active circuit, and a passive circuit.

4. The integrated circuit of claim 1, wherein the input port of four-port passive coupler is a differential input port, wherein the first output port of the four-port passive coupler is a differential output port, wherein the second output port of the four-port passive coupler is a differential output port, and wherein the isolated port of the four-port passive coupler is a differential port.

5. An integrated circuit comprising: a four-port passive coupler having an input port, an isolated port, a first output port and a second output port, wherein an input signal is received by the four-port passive coupler onto the input port, wherein a first signal is output from the first output port, wherein a second signal is output from the second output port, wherein a phase of the second signal is different from a phase of the first signal; a first load having an input port; a first conductor that couples the input port of the first load to receive the first signal from the first output port of the four-port passive coupler; a second load having an input port; a second conductor that couples the input port of the second load to receive the second signal from the second output port of the four-port passive coupler; and a complex termination impedance circuit coupled to terminate the isolated port of the four-port passive coupler, wherein the complex termination impedance circuit includes an inductive element or a capacitive element, and wherein the complex termination impedance circuit controls a phase difference between the first signal and the second signal.

6. The integrated circuit of claim 5, wherein the complex termination impedance circuit has a first terminal that is coupled to the isolated port of the four-port passive coupler, and wherein the complex termination impedance circuit has a second terminal that is coupled to a ground conductor.

7. The integrated circuit of claim 5, wherein the first conductor has a first conductor resistance between the first output port of the four-port passive coupler and the input port of the first load that is less than two ohms, and wherein the second conductor has a second conductor resistance between the second output port of the four-port passive coupler and the input port of the second load that is less than two ohms.

8. The integrated circuit of claim 7, wherein the first conductor has a capacitance to signal ground that is less than twenty femtofarads, and wherein the second conductor has a capacitance to signal ground that is less than twenty femtofarads.

9. The integrated circuit of claim 8, wherein the first conductor comprises a first length of a metal conductor having a substantially uniform width and thickness, wherein the first length is more than fifty microns, and wherein the second conductor comprises a second length of a metal conductor having a substantially uniform width and thickness, wherein the second length is more than fifty microns.

10. The integrated circuit of claim 5, wherein there is no matching network in a signal path of the first signal from the first output port of the four-port passive coupler and the input port of the first load, and/or wherein there is no matching network in a signal path of the second signal from the second output port of the four-port passive coupler and the input port of the second load.

11. The integrated circuit of claim 5, wherein the four-port passive coupler comprises:
a first winding, wherein the input port is a first terminal end of the first winding, and wherein the isolated port is a second terminal end of the first winding; and
a second winding that is coupled to the first winding, wherein the first output port is a first terminal end of the second winding, and wherein the second output port is a second terminal end of the second winding.

12. The integrated circuit of claim 5, wherein the complex termination impedance circuit has a positive reactance.

13. The integrated circuit of claim 5, wherein the complex termination impedance circuit has a negative reactance.

14. The integrated circuit of claim 5, wherein the complex termination impedance circuit has a switchable/tunable reactance.

15. An integrated circuit comprising: a differential coupler having a differential input port, a differential isolated port, a first differential output port and a second differential output port, wherein a differential input signal of a frequency F is received onto the differential input port; a first load having a differential input port, wherein the first load receives a first differential signal of phase $\phi 1$ from the first differential output port of the differential coupler and onto the differential input port of the first load; a second load having a differential input port, wherein the second load receives a second differential signal of phase $\phi 2$ from the second differential output port of the differential coupler and onto the differential input port of the second load, wherein $\phi 1$ and $\phi 2$ are different; and a complex termination impedance circuit coupled to terminate the differential isolated port of the differential coupler, wherein the complex termination impedance has a reactance of more than two ohms at frequency F, and wherein the complex termination impedance circuit controls a phase difference between $\phi 1$ and $\phi 2$.

16. The integrated circuit of claim 15, wherein the complex termination impedance circuits comprises:
a first two-terminal complex termination impedance circuit; and
a second two-terminal complex termination impedance circuit, wherein a first terminal of the first two-terminal complex termination impedance circuit is coupled to a first terminal of the differential isolated port, wherein a first terminal of the second two-terminal complex termination impedance circuit is coupled to a second terminal of the differential isolated port, and wherein a second terminal of the first two-terminal complex termination impedance circuit is coupled to a second terminal of the second two-terminal complex termination impedance circuit.

17. The integrated circuit of claim 16, wherein the second terminals of the first and second two-terminal complex termination impedance circuits are grounded.

18. The integrated circuit of claim 15, wherein the differential coupler comprises:
a first four-port passive coupler having an input port, an isolated port, a first output port and a second output port; and
a second four-port passive coupler having an input port, an isolated port, a first output port and a second output port, wherein the input ports of the first and second four-port passive couplers together comprise the differential input port of the differential coupler, wherein the first output ports of the first and second four-port passive couplers together comprise the first differential output port of the differential coupler, wherein the second output ports of the first and second four-port passive couplers together comprise the second differential output port of the differential coupler, and wherein the isolated ports of the first and second four-port passive couplers together comprise the differential isolated port of the differential coupler.

19. The integrated circuit of claim 15, wherein the differential coupler comprises:
a first multi-turn winding;
a second multi-turn winding that is magnetically coupled to the first multi-turn winding;
a third multi-turn winding; and
a fourth multi-turn winding that is magnetically coupled to the third multi-turn winding.

20. The integrated circuit of claim 15, wherein the first pair of conductors comprises a first conductor and a second conductor, wherein the first conductor of the first pair of conductors has a resistance between the differential coupler and the first load that is less than two ohms, wherein the first conductor of the first pair of conductors has a capacitance to signal ground that is less than twenty femtofarads, wherein the second pair of conductors comprises a first conductor and a second conductor, wherein the first conductor of the second pair of conductors has a resistance between the differential coupler and the second load that is less than two ohms, wherein the second conductor of the second pair of conductors has a capacitance to signal ground that is less than twenty femtofarads.

21. The integrated circuit of claim 15, wherein there is no matching network in a signal path of the first differential signal from the first differential output port of the differential coupler to the differential input port of the first load, and/or wherein there is no matching network in a signal path of the second differential signal from the second output differential output port of the differential coupler to the differential input port of the second load.

* * * * *